United States Patent [19]

Yin

[11] Patent Number: 5,404,034
[45] Date of Patent: Apr. 4, 1995

[54] SYMMETRICAL MULTI-LAYER METAL LOGIC ARRAY WITH CONTINUOUS SUBSTRATE TAPS

[75] Inventor: Patrick Yin, Fremont, Calif.

[73] Assignee: Aspec Technology, Inc., Sunnyvale, Calif.

[21] Appl. No.: 194,729

[22] Filed: Feb. 10, 1994

Related U.S. Application Data

[63] Continuation of Ser. No. 898,203, Jun. 10, 1992, abandoned.

[51] Int. Cl.⁶ .......................................... H01L 27/10
[52] U.S. Cl. .................................. 257/206; 257/204
[58] Field of Search ............... 257/206, 204, 202, 207

[56] References Cited

U.S. PATENT DOCUMENTS

| | | | |
|---|---|---|---|
| 4,651,190 | 3/1987 | Suzuki et al. | 257/206 |
| 4,884,118 | 11/1989 | Hui et al. | 257/206 |
| 4,999,698 | 3/1991 | Okuno et al. | 257/206 |
| 5,072,285 | 12/1991 | Ueda et al. | 257/206 |

FOREIGN PATENT DOCUMENTS

| | | | |
|---|---|---|---|
| 60-123041 | 7/1985 | Japan | 257/206 |
| 60-130138 | 7/1985 | Japan | 257/206 |
| 62-130538 | 6/1987 | Japan | 257/206 |
| 63-9132 | 1/1988 | Japan | 257/206 |

*Primary Examiner*—Jerome Jackson
*Assistant Examiner*—Courtney A. Bowers
*Attorney, Agent, or Firm*—Benman Collins & Sawyer

[57] ABSTRACT

A gate array architecture is disclosed that utilizes significantly less silicon area than the prior art. The core cell includes a four transistor arrangement in which a substrate tap is located adjacent to the transistor pair. This provides for a more "symmetric" cell array than those in the prior art. Through the placement of the taps outside of the transistors the power line connections can be routed in a simple and efficient manner. In addition the gate array architecture mirrors pairs of transistor columns to allow for the sharing of substrate taps between pairs of columns. This mirroring feature further reduces routing complexity.

7 Claims, 4 Drawing Sheets

NEW ARCHITECTURE

NEW ARCHITECTURE

SYMMETRICAL MULTI-LAYER METAL LOGIC ARRAY WITH CONTINUOUS SUBSTRATE TAPS

This is a continuation of application Ser. No. 07/898,203, filed on Jun. 10, 1992, now abandoned.

FIELD OF THE INVENTION

The present invention relates to a complementary metal-oxide silicon (CMOS) logic gate array and more particularly to a CMOS logic gate array having a plurality of core cells.

BACKGROUND OF THE INVENTION

Gate arrays are used in VLSI integrated circuit chips to implement MOSFET circuits in semiconductor wafers. An MOS gate array consists of an array of MOS transistor sources and drains separated by channels, above which are formed gates to control the conductivity of the channels and thus the state of the transistors. An array of these gates (and their sources and drains) becomes functional only when connected by conductive wiring to appropriate other elements.

Generally, the connecting is accomplished in two steps: a library of macrocells is available to translate simple frequently used logic functions such as NAND, flip-flop, ADD, multiplexer, and counter into a gate array wiring pattern, then the macrocells are connected together to form the complex logic functions of the VLSI chip.

Although conceptually there are two steps, the actual metallization to accomplish the two steps is laid out in as few layers as possible, preferably two, so the metal to implement a single macrocell and the metal to connect macrocells to each other is in the same metallization layers. Therefore if an area in a metal layer is used for connecting points within a macrocell, it is not also available for connecting macrocells to each other.

There has been considerable interest in implementing complex logic operations on smaller areas of semiconductor material, while simultaneously retaining the flexibility provided by a gate array in which identical structural units or core cells repeat throughout a large portion of the semiconductor area. A gate array structure consists generally of a base array of many active areas which can be fabricated as a standard product on which is formed one or more "personality layers" comprising conductive material to interconnect the active areas into a desired logical structure.

The personality layers reflect the function or functions to be implemented by the finished array. A given base array can be used to implement many different functions by appropriately designing the personality layers. Thus a gate array allows many different logic functions to be implemented using the same base array. The geometry of the base array cell affects the ability of the designer using later metallization to achieve a final product having maximum density and performance.

One prior art layout of a CMOS logic array required dedicated routing channels that are positioned in between pairs of columns of active areas. Typically, each routing channel contains space for a fixed number of leads, i.e. routing tracks, which run on top of oxide isolation regions formed between the pairs of columns. To promote standardization and flexibility in implementing multiple functions within one substrate layout, generally the same number of routing tracks are allocated to each routing channel within the array.

An improvement on this type of prior art array is shown in U.S. Pat. No. 4,884,118 entitled, Double Metal HCMOS Compacted Array, assigned to LSI Logic Corporation. In this embodiment, active areas are arranged in adjacent columns of alternating conductivity types with no intervening area allocated for metal routing. The placement of alternating conductivity type columns allows for the formation of CMOS type devices in which the P-type regions are on either the right or left sides of the devices depending upon the needs of the circuit.

Thus, in a CMOS circuit application, if some substrate area must be left unused in order to allow for the most efficient placement of routing channels, less substrate area need be wasted in the overall layout since the next CMOS device may begin at the next column either n-type or p-type whichever is available.

This prior art method has a high flexibility of circuit design by allowing increments of a single column to be dedicated to routing. This core array design however, has the disadvantage of requiring a symmetrical array, that is, a p channel lying adjacent to an n-channel. This disadvantage manifests itself in several ways. A gate array using the prior art structure described in the above mentioned patent requires at least one contact point that is dedicated to the connection of the substrate taps between the active areas.

In addition to the alternating nature of the active regions, there is a distinct possibility that there has to be extensive routing of the wires in the integrated circuit when providing the personality layer to provide the desired logical structure described in the above-mentioned patent.

The type of logic array described in the above mentioned patent has a core cell of eight transistors which include two substrate taps therebetween. Typically in the prior art cell described in the above mentioned patent, what is shown is an active area with a first pair of p-channel transistors on one side, a second pair of p-channel transistors on a second side and a substrate tap therebetween. This prior art cell includes a second active area with a first pair of n-channel transistors on one side, a second pair of n-channel transistor on a second side and a substrate tap therebetween. The substrate taps provide the P-channel and N-channel substrate with a voltage potential.

The disadvantage of the substrate tap being between p or n channel transistors is gate density (i.e. number of gates per sq.mm). The diffusion spacing between the substrate taps and transistor diffusion is greater than that of the polysilicon. Secondly, the alternating configuration is inefficient at the chip level in random access memory (RAM) or read-only memory (ROM) implementations when the layout is a complex bus structure.

Typically this type of cell is utilized to provide multiple columns of active areas to provide the gate array architecture. This cell has the further disadvantage of requiring the jumping of a column when connections must be made between columns of the same conductivity type. For example in the case when two p-channel and one n-channel are used to form a cell i.e. p-p-n, the p-channel has half the speed of an n-channels and two p-channel will give a more balanced propagation delay. This adds significant complexity to the routing of these connections. Finally due to the alternating nature of the columns and position of the substrate tap (between the transistors) routing of the voltage potential lines and other metal connections can also become quite complex.

The present invention overcomes the above-mentioned problems with known gate array cells. In addition, the gate array geometry of the present invention accommodates an optimum circuit layout with minimum waste of silicon area and also accommodates efficient implementation of the personality layers required for the desired logical design.

SUMMARY OF THE INVENTION

A novel gate array is provided that comprises a four transistor basic core cell. This array allows for a more symmetric design than previously known gate array structures. The four transistor core cell is accomplished by placing a substrate tap outside of the transistor pairs rather than between them as is shown in the prior art.

The symmetric design is accomplished by forming the core cells into columns and mirroring the column of transistor pairs. What is meant by mirroring is that if the first pair of columns comprises a n-channel and a p-channel, the adjoining pair of columns comprises p-channel and n-channel columns in that order. In so doing adjacent columns can share the power supply lines for the substrate taps.

In addition, since all the substrate taps are aligned outside the cells the number of contact points can be reduced on the active regions by one because there is no need to dedicate one of the contacts (in the second metal layer track) to connecting the corresponding power supply and the substrate taps in the gate array structure. Since the substrate tap is a continuous strip of diffusion at the chip level it also has better electrical characteristics than in prior art cells.

Finally, through this type of gate array structure, higher useable gate density is expected with additional routing layers than when utilizing previously known gate arrays. The above-mentioned improvement is obtained due to the increased symmetry of the cell.

DETAILED DESCRIPTION

The present invention relates to an improvement in gate array technology. The following description is presented to enable one of ordinary skill in the art to make and use the invention and is provided in the context of a patent application and its requirements. Various modifications to the preferred embodiment will be readily apparent to those skilled in the art, and the generic principles defined herein may be applied to other embodiments. Thus, the present invention is not intended to be limited to the embodiment shown, but is to be accorded the widest scope consistent with the principles and features described herein.

Figure 1:
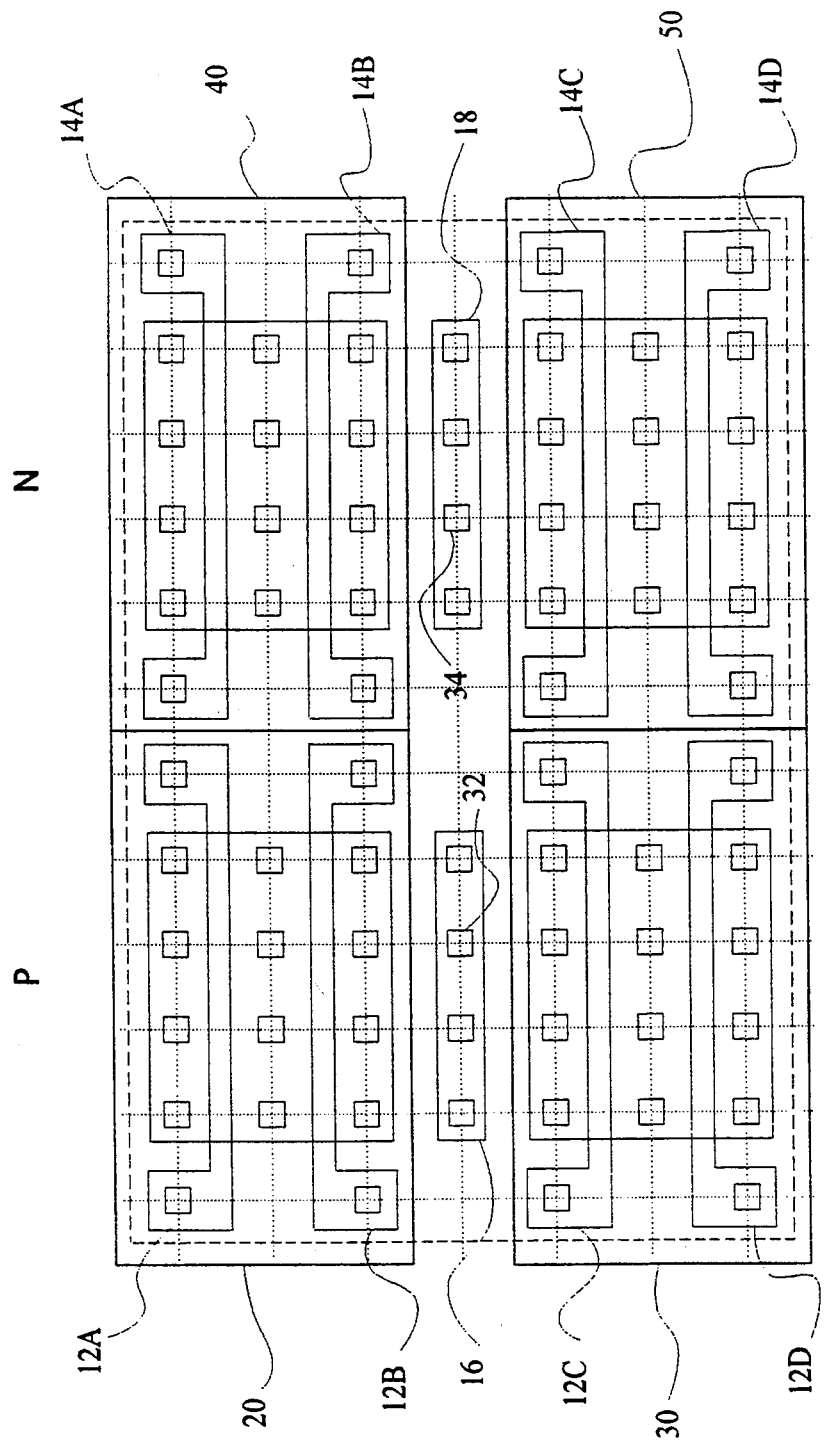
FIG. 1 is a diagram of a prior art conventional core cell for a gate array.

FIG. 1 shows in detail four active areas which comprise eight transistors and the associated substrate taps for the active areas. In the area bounded by 20 is an active area which comprises two p-type transistors 12a and 12b. In the area bounded by 30 is an active area which comprises p-type transistors 12c and 12d.

In the area bounded by block 40 is an active area which comprises n-type transistor 14a and 14b. In the area bounded by 50 is an active area which comprises n-type transistors 14c and 14d.

Each of the transistors 12a-12d and 14a-14d include a source, drain and gate regions for controlling the flow of current therebetween. Also between active areas 20 and 30 is substrate tap 16 and between active areas 40 and 50 is substrate tap 18. These substrate taps 16 and 18 are utilized for providing the voltage bias to the transistors 12a-d and 14a-d, respectively. It is known that the substrate taps 16 and 18 are doped with opposite material to the column it is associated with. In this type of cell four contact points 32, 34 are utilized on each of the substrate taps 16 and 18 respectively to provide for proper electrical contact between the substrate taps and the first metal layer power bus.

In this arrangement even though there is some symmetry between the active areas 20,30 and 40,50 because the substrate taps 16, 18 are located within active areas, there is a loss of symmetry when the adjacent transistors are used for designing logical circuits. In addition this cell requires that one of the contact points 32, 34 be dedicated to allow for electrical contact the taps and the power bus. This common contact point 32,34 ensures that the voltage potential is the same for all of the taps 16, 18.

The other less obvious disadvantage of this cell is the asymmetry created by virtue of the position of the substrate tap. For example when a macrocell uses an odd number of gates (each gate comprises 2n and 2p transistors) there are two possible versions of this cell. For example, one with substrate tap on the left side of the macrocell and one version with the substrate tap located on the right. The requirement of having these extra version will demand that the cell library be larger. Hence, the more effort will be required to maintain the library.

Figure 2:
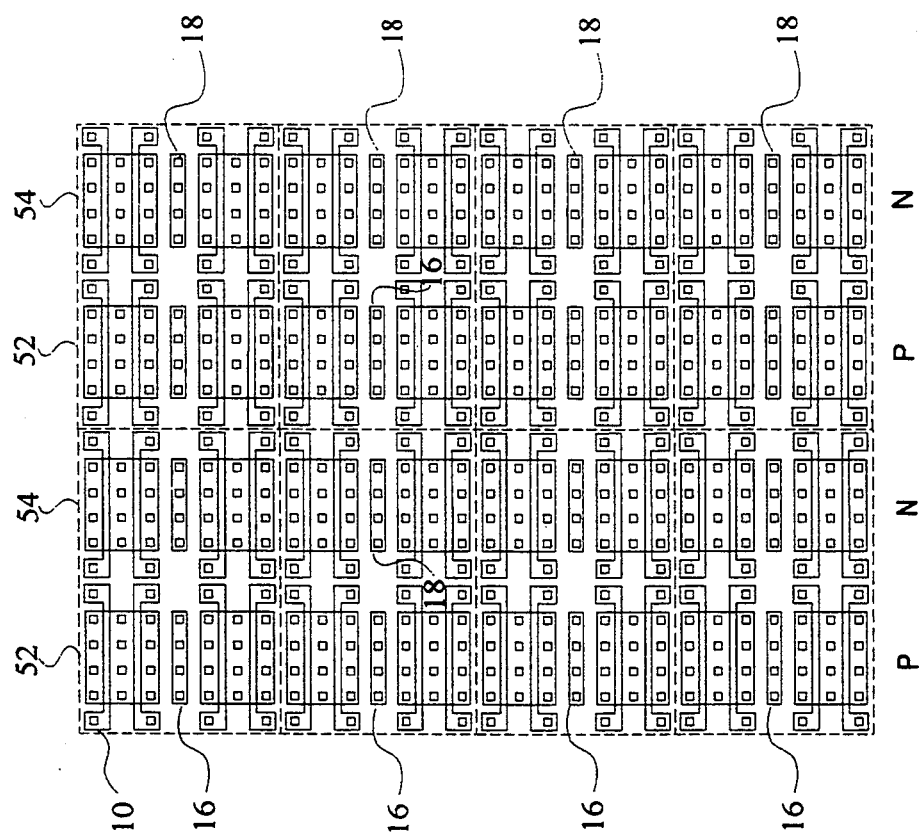
FIG. 2 is a conventional gate array architecture using the core cell of FIG. 1.

Referring now to FIG. 2 what is shown is a diagram of gate array architecture 50 utilizing a plurality of cells 10 of FIG. 1. The architecture 50 includes a plurality alternating p-channel 52 and n-type 54 active areas. Each of these regions are made up of the core cells 10 shown in the prior art of FIG. 1. In this architecture the n-channel and p-channel active areas alternate to provide a gate array structure 50 in accordance with the prior art. As has been before mentioned this type of arrangement lends itself to gate density problems due to the location of the substrate taps 16,18.

With this type of architecture oftentimes if two different p-channel active areas need to be connected for more balanced delay characteristics it may be necessary to skip a region due to the alternating nature of the active areas or more likely less efficient layout occurs by not using some of the n-channel devices. When making interconnections using this type of arrangement the wiring patterns can become quite inefficient. All of these problems taken together can significantly increase the size of the gate array circuit when designing the personality layers for the gate array architecture.

Figure 3:
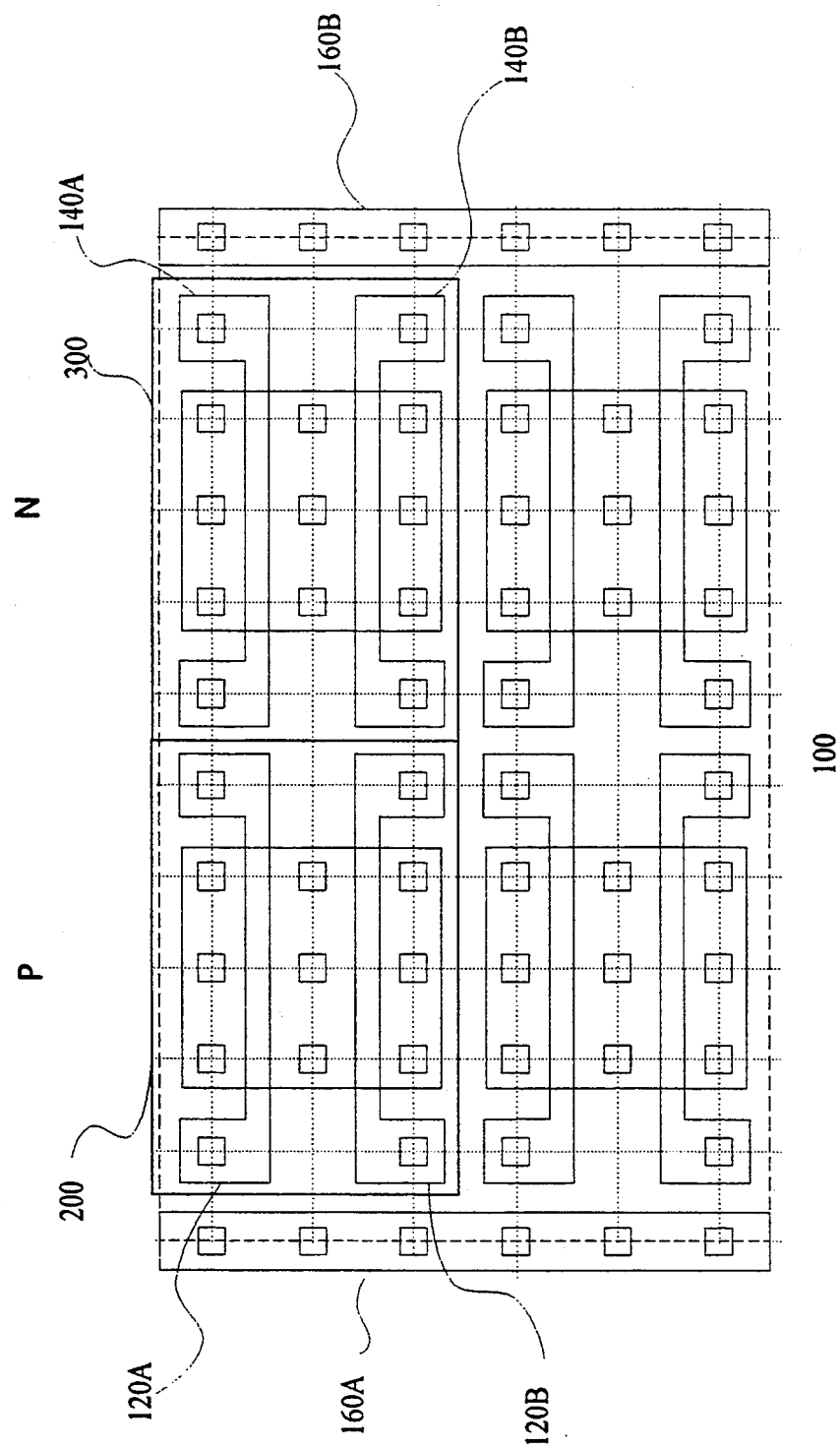
FIG. 3 is a diagram of a core cell in accordance with the present invention.

The present invention overcomes these problems by changing the core cell into a more symmetrical unit. Referring now to FIG. 3, what is shown is a gate array core cell 100 that has more symmetry than the cell 10 shown in FIG. 1. In this embodiment, the gate array core cell 100 includes four transistors 120a-b and 140a-b rather than the eight required in the prior art structure of FIG. 1.

In this embodiment the area bounded by 200 is an active area which comprises two p-type transistors 120a-120b. The area bounded by 300 is an active area which comprises two n-channel transistors 140a-b. Each of the transistors 120a-b and 140a-b include a source drain and gate region for controlling the flow of current therebetween. In the present invention the substrate taps 160a-b are located adjacent to their associated transistor pair.

Hence, the substrate taps 160a-b are not an integral part of the routing area of the core cell as in the prior art cell of FIG. 1. Since the taps 160a-b are outside of the routing area the power line which connects the substrate taps runs on the top the substrate taps. Hence, in this embodiment only three contact points are needed unlike the four contact points required in the prior art cell. In addition through the use of this type of core cell some other advantages can be obtained when utilizing this in a double metal gate array structure.

Figure 4:
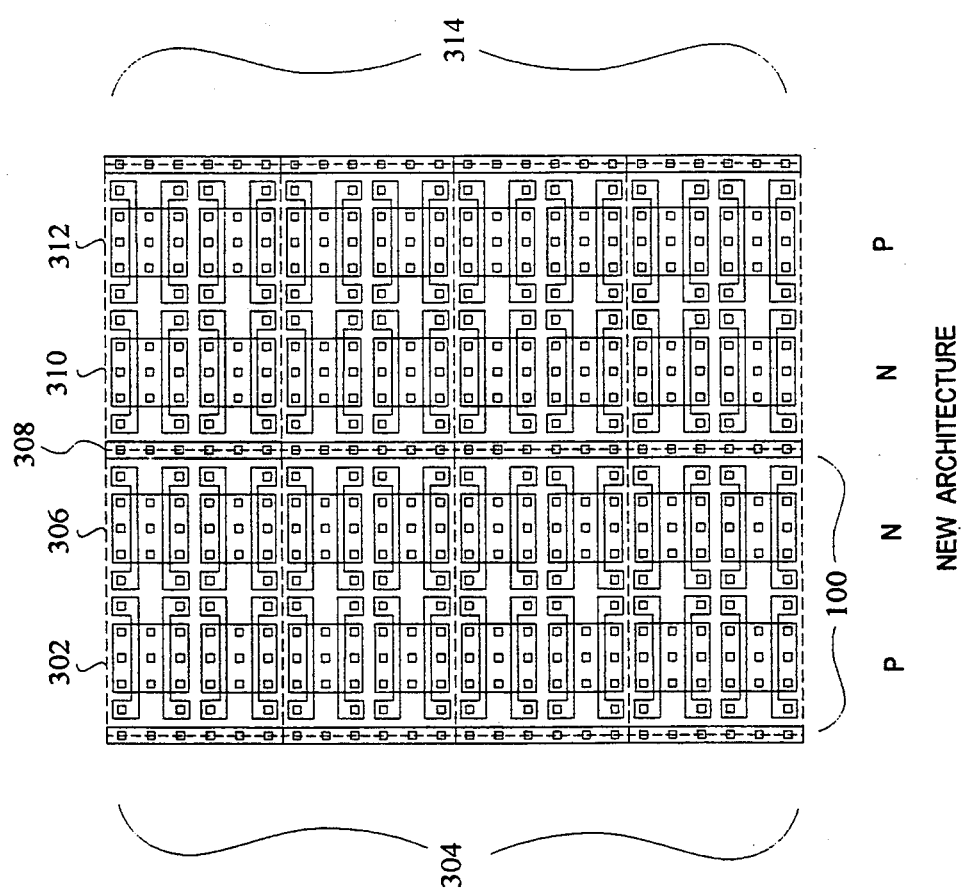
FIG. 4 is a diagram of a gate array architecture utilizing the core cell of FIG. 3 in accordance with the present invention.

Referring now to FIG. 4 shown is a gate array architecture 300 that utilizes the cell 100 of FIG. 3. This type of architecture 300 has several advantages over the prior art architecture. The first advantage is that there is a stronger degree of symmetry than the prior art architecture 50 due to the reduced number of transistors in the cell 100. In addition, since the substrate taps are adjacent to the transistor pair, rather than therebetween, the routing problems associated with prior art are virtually eliminated.

There is also an additional advantage derived from this gate array architecture 300. As is seen the architecture includes a first p-channel column 302 and a strip of substrate taps 304 that runs the length of the p-channel column 302. Since the substrate taps 304 run the length of the p-channel column 302, the taps 304 have better electrical characteristics than those taps disclosed in the prior art. On the other side of the p-channel column 302 is an n-channel column 306. Adjacent to the n-channel column 306 is another strip of substrate taps 308 that runs the length of the n-channel column 308. P-channel column 302 and n-channel column 306 comprise a first transistor column pair.

Adjacent to the strip of substrate taps 308 is an n-channel column 310. Adjacent to the n-channel column 310 is a p-channel column 312. Running the length of and adjacent to the p-channel column 312 is another strip of substrate taps 314. N-channel column 310 and p-channel column 312 comprise a second transistor column pair. It should be readily apparent that although only four columns are shown that there can be any number and they can be in any order of columns and that would be within the spirit and scope of the present invention.

As is readily apparent instead of the alternating arrangement shown in the prior art, pairs of n-p channel columns are mirrored with the adjacent p-n column pair. This mirror arrangement provides two advantages, firstly the power lines are routed outside the active areas on the group of substrate taps that run the length of the active areas. Therefore the routing problems associated with substrate taps being within the core cells known in the prior art are avoided.

An additional advantage of the present invention is through this mirror arrangement the common columns can share substrate taps. For example in this embodiment the two n-channel columns 306 and 310 can share substrate taps 308. The mirror arrangement will further reduce routing difficulty when providing the personality layer for the gate arrays.

The other advantage of this type of architecture is that the mirroring of the n-p column pairs allows for direct connections between adjacent regions of the same type. Hence unlike the prior art architectures, the architecture 300 of the present invention reduces the need for complex routing schemes when making connections across common active areas.

Although the present invention has been described in accordance with the embodiment shown in FIG. 3 and 4, one of ordinary skill in the art recognizes that there could be variations to the embodiment and those variations would be within the spirit and scope of the present invention. Accordingly many modifications may be made by one of ordinary skill in the art without departing from the spirit and scope of the present invention, the scope of which is defined solely by the appended claims.

What is claimed is:

1. An integrated circuit gate array structure comprising:

a semiconductor substrate in which are located a plurality of columns of semiconductor material of a first conductivity type and a plurality of columns of semiconductor material of a second conductivity type; the substrate having one column of the first conductivity type and one column of the second conductivity type adjacent to each other to form a first column pair mirroring a next column pair such that the conductivity of a first column of the next column pair is the same as a last column of the first column pair;

active areas including a plurality of contact points formed within the columns; the plurality of contact points can be connected to conductive material, thereby forming active regions; and tap regions formed outside the columns pairs, each of the tap regions being associated with two columns of two column pairs, the tap regions having an opposite conductivity as the columns to which they are adjacent and the tap region can be connected with conductive material, the tap regions being doped with an opposite material than their adjacent columns thereby allowing current and voltage characteristics of the columns to be controlled;

wherein the active areas and the column pairs are placed so as to form a plurality of adjacent cells, each cell comprising a first active area within one of the columns of the first conductivity type and a second active area within one of the columns of the second conductivity type; each cell including one column pair; and wherein the column pairs are situated to allow common conductivity columns to share tap regions, the plurality of cells being mirrored in a first direction such that the arrangement of the conductivity types of the column pair of one cell is inverted in relation to the adjacent next column pair of a adjacent next cell and the plurality of cells in a second direction being identical to provide increased density of the array structure.

2. An integrated circuit gate array structure of claim 1 in which a core cell of the gate array structure comprises:

a first pair of transistors within one of the columns of the first conductivity type, a second pair of transistors within one of the columns of the second conductivity type, and a substrate tap within one of the tap regions located adjacent to either the first or second pair of transistors.

3. The gate array structure of claim 1 in which the tap regions comprise strips of substrate taps that run the length of the column pairs.

4. An integrated circuit gate array structure comprising:

a semiconductor substrate in which a plurality of columns of p-type semiconductor material and a plurality of columns of n-type semiconductor material, the substrate having one of the plurality of p-channel columns adjacent to an n-channel column to form a first column pair, the substrate further having a next pair of columns positioned such that the next column pair mirror the first column pair such that the conductivity of a first column of the next column pair is the same as a last column of the first column pair, active areas including a plurality of contact points formed within the columns; the contact points can be connected to conductive material, thereby forming active regions, and tap regions formed outside the column pairs, each of the tap regions being associated with two columns of two column pairs, the tap regions having the opposite conductivity as the columns to which they are adjacent to and the tap regions can be connected with conductive material, the tap regions further being heavily doped with conductive material of the opposite type than that of the column it is adjacent to, thereby allowing current and voltage characteristics of the columns to be controlled, wherein the active areas and the column pairs are placed so as to form a plurality of adjacent cells, each cell comprising of a first active area within one of the columns of the first conductivity type and a second active area within one of the columns of the second conductivity type; each cell including one column pair; and wherein the column pairs are situated to allow common conductivity columns to share tap regions, the plurality of cells being mirrored in a first direction such that the arrangement of the conductivity types of the column pair of one cell is inverted in relation to the adjacent next column pair of a adjacent next cell and the plurality of cells in a second direction being identical to provide increased density of the array structure.

5. The integrated gate array structure of claim 4 in which the tap regions comprise strips of substrate taps that run the length of the column pairs.

6. The gate array structure of claim 1 in which the first direction is horizontal and the second direction is vertical.

7. The gate array structure of claim 4 in which the first direction is horizontal and the second direction is vertical.

* * * * *